(12) United States Patent
Kahen et al.

(10) Patent No.: US 6,674,776 B2
(45) Date of Patent: Jan. 6, 2004

(54) ORGANIC VERTICAL CAVITY LASING DEVICES CONTAINING PERIODIC GAIN REGIONS

(75) Inventors: Keith B. Kahen, Rochester, NY (US); John A. Lebens, Rush, NY (US); Anna L. Hrycin, Rochester, NY (US); John P. Spoonhower, Webster, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/066,936

(22) Filed: Feb. 4, 2002

(65) Prior Publication Data

US 2003/0147446 A1 Aug. 7, 2003

(51) Int. Cl.[7] .................................................. H01S 3/14
(52) U.S. Cl. ............................. 372/39; 372/96; 372/43
(58) Field of Search .............................. 372/96, 43, 39

(56) References Cited

U.S. PATENT DOCUMENTS

| | | | |
|---|---|---|---|
| 4,873,696 A | | 10/1989 | Coldren et al. |
| 4,881,236 A | | 11/1989 | Brueck et al. |
| 5,052,016 A | * | 9/1991 | Mahbobzadeh et al. ...... 372/96 |
| 5,307,363 A | * | 4/1994 | Hosokawa et al. ........... 372/53 |
| 6,160,828 A | * | 12/2000 | Kozlov et al. ................ 372/39 |
| 6,194,119 B1 | | 2/2001 | Wolk et al. |
| 6,392,250 B1 | * | 5/2002 | Aziz et al. .................... 257/40 |

OTHER PUBLICATIONS

K. Kinoshita et al., IEEE J. Quant. Electron. QE–23, 882 (1987).
K.D. Choquette et al., Proc. IEEE 85, 1730 (1997).
C. Wilmsen et al., *Vertical–Cavity Surface–Emitting Lasers*, Cambridge University Press, Cambridge, 2001.
T. Ishigure et al., Electron. Lett. 31, 467 (1995).
P.L. Gourley et al., Appl. Phys. Lett. 54, 1209 (1989).
N. Tessler et al., Appl. Phys. Lett. 74, 2764 (1999).
Corzine et al. IEEE J. Quant. Electr. 25, 1513 (1989).
M. Berggren et al., Nature 389, 466 (1997).

* cited by examiner

*Primary Examiner*—Quyen Leung
*Assistant Examiner*—Leith A Al-Nazer
(74) *Attorney, Agent, or Firm*—Raymond L. Owens

(57) ABSTRACT

An organic vertical cavity laser light producing device includes a bottom dielectric stack reflective to light over a predetermined range of wavelengths; an organic active region for producing laser light; and a top dielectric stack spaced from the bottom dielectric stack and reflective to light over a predetermined range of wavelengths. The device also includes the active region in which is contained one or more periodic gain region(s) and organic spacer layers disposed on either side of the periodic gain region(s) and arranged so that the periodic gain region(s) is aligned with the antinodes of the device's standing wave electromagnetic field.

6 Claims, 6 Drawing Sheets

ORGANIC VERTICAL CAVITY LASING DEVICES CONTAINING PERIODIC GAIN REGIONS

CROSS-REFERENCE TO RELATED APPLICATION

Reference is made to commonly assigned U.S. patent application Ser. No. 09/832,759 filed Apr. 11, 2000 by Keith B. Kahen et al. and U.S. patent application Ser. No. 10/066,829 filed Feb. 4, 2002 entitled "Organic Vertical Cavity Phase-Locked Laser Array Device" by Keith B. Kahen; the disclosures of which are incorporated herein by reference.

FIELD OF INVENTION

This invention relates to the field of light-emitting devices. More specifically, this invention relates to organic-based solid-state lasers.

BACKGROUND OF THE INVENTION

Vertical cavity surface emitting lasers (VCSELs) based on inorganic semiconductors (e.g., AlGaAs) have been developed since the mid-80's (K. Kinoshita et al., IEEE J. Quant. Electron. QE-23, 882 [1987]). They have reached the point where AlGaAs-based VCSELs emitting at 850 nm are manufactured by a number of companies and have lifetimes beyond 100 years (K. D. Choquette et al., Proc. IEEE 85, 1730 [1997]). With the success of these near-infrared lasers in recent years, attention has turned to other inorganic material systems to produce VCSELs emitting in the visible wavelength range (C. Wilmsen et al., *Vertical-Cavity Surface-Emitting Lasers*, Cambridge University Press, Cambridge, 2001). There are many fruitful applications for visible lasers, such as display, optical storage reading/writing, laser printing, and short-haul telecommunications employing plastic optical fibers (T. Ishigure et al., Electron. Lett. 31, 467 [1995]). In spite of the worldwide efforts of many industrial and academic laboratories, much work remains to create viable laser diodes (either edge emitters or VCSELs) which span the visible spectrum.

In the effort to produce visible wavelength VCSELs, it would be advantageous to abandon inorganic-based systems and focus on organic-based laser systems. Organic materials have properties making them suitable for gain media in these lasers, such as low scattering/absorption losses and high quantum efficiencies. Organic lasers offer the advantage over inorganic systems in that they are relatively inexpensive to manufacture and can be made to emit over the entire visible range.

The usual route for making a manufacturable laser diode system is to use electrical injection rather than optical pumping to create the necessary population inversion in the active region of the device. This is the case for inorganic systems, since their optically pumped thresholds for broad-area devices are on the order of $10^4$ W/cm$^2$ (P. L. Gourley et al., Appl. Phys. Lett. 54, 1209 [1989]). Such high power densities can only be obtained by using other lasers as the pump sources, precluding that route for inorganic laser cavities. Unpumped organic laser systems have greatly reduced combined scattering/absorption loss ($\sim$0.5 cm$^{-1}$) at the lasing wavelength, especially if a host-dopant combination is used as the active media. As a result, optically pumped power thresholds below 1 W/cm$^2$ should be attainable, especially when a VCSEL-based microcavity design is employed in order to minimize the active volume (which results in lower thresholds). At these threshold power levels it becomes possible to optically pump organic-based vertical laser cavities using incoherent light-emitting diodes (LEDs). This result is highly significant for amorphous organic laser systems, since driving them by electrical injection has, to this date, been unobtainable mainly as a result of the low carrier mobility of organic materials (N. Tessler et al., Appl. Phys. Lett. 74, 2764 [1999]).

Obtaining thresholds below 1 W/cm$^2$ requires optimal usage of the pump-beam energy. For inorganic vertical cavity laser systems, it has been taught by Brueck et al. (U.S. Pat. No. 4,881,236) and Coldren et al. (U.S. Pat. No. 4,873,696) that by aligning the gain media with the antinodes of the laser's standing wave electromagnetic field, unwanted spontaneous emission is significantly reduced and the laser's power conversion efficiency is enhanced. To date, these ideas have not been applied to organic-based laser systems.

SUMMARY OF THE INVENTION

It is an object of this invention to provide an organic surface emitting laser arrangement that is particularly suitable to permitting optimization of the organic active region, improving power conversion efficiency, and removing unwanted parasitic spontaneous emission.

These objects are achieved by an organic vertical cavity laser light producing device, comprising:

a) a bottom dielectric stack reflective to light over a predetermined range of wavelengths;

b) an organic active region for producing laser light;

c) a top dielectric stack spaced from the bottom dielectric stack and reflective to light over a predetermined range of wavelengths;

d) the organic active region includes one or more periodic gain region(s) and organic spacer layers disposed on either side of the periodic gain region(s) and arranged so that the periodic gain region(s) is aligned with the antinodes of the device's standing wave electromagnetic field.

ADVANTAGES

It is an advantage of the present invention to improve the operation of a vertical cavity design incorporating high reflectance top and bottom dielectric stacks, having gain regions consisting of small-molecular weight organic material, with the gain region(s) placed at the antinodes of the standing wave electric field of the laser. As a result, the power conversion efficiency is improved, and unwanted output due to spontaneous emission is significantly reduced.

DETAILED DESCRIPTION OF THE INVENTION

Figure 1:
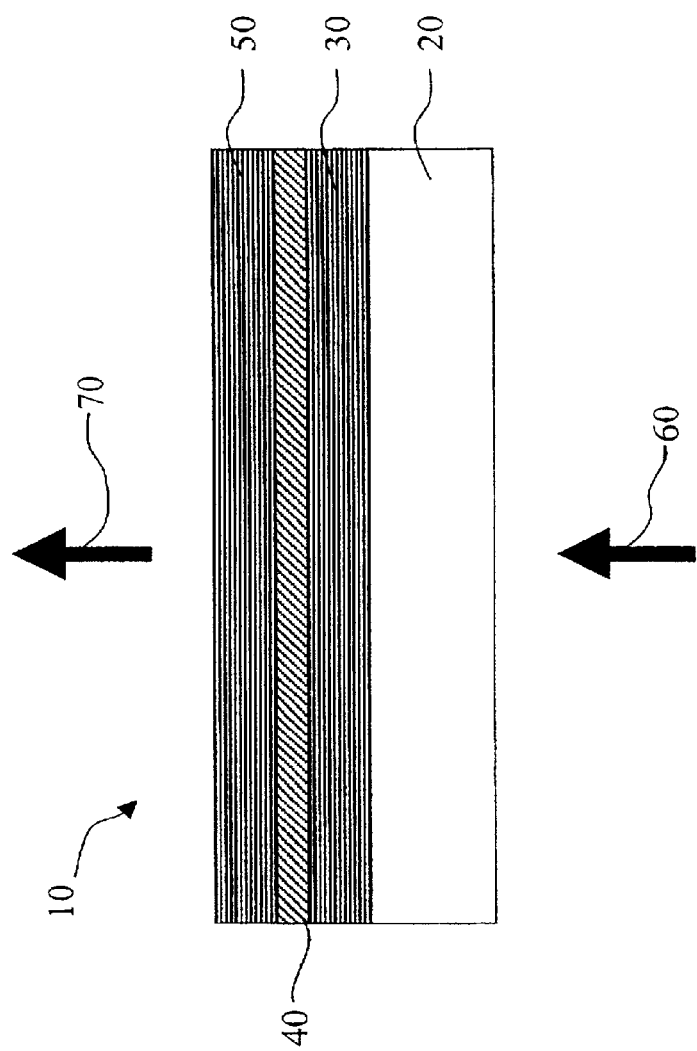
FIG. 1 shows a side view schematic of an optically pumped organic-based vertical cavity laser according to the present invention.

A schematic of a vertical cavity organic laser structure 10 is shown in FIG. 1. The substrate 20 can either be light transmissive or opaque, depending on the intended direction of optical pumping and laser emission. Light transmissive substrates 20 may be transparent glass or plastic. Alternatively, opaque substrates including, but not limited to, semiconductor material (e.g. silicon) or ceramic material may be used in the case where both optical pumping and emission occur through the same surface. On the substrate is deposited a bottom dielectric stack 30 followed by an organic active region 40. A top dielectric stack 50 is then deposited. A pump-beam 60 optically pumps the vertical cavity organic laser structure 10. The source of the pump-beam may be incoherent, such as, emission from a light-emitting diode (LED). Alternatively, the pump-beam may originate from a coherent laser source. The figure shows laser emission 70 from the top dielectric stack 50. Alternatively, the laser structure could be optically pumped through the top dielectric stack 50 with the laser emission through the substrate 20 by proper design of the dielectric stack reflectivities. In the case of an opaque substrate, such as silicon, both optical pumping and laser emission occur through the top dielectric stack 50.

Figure 2:
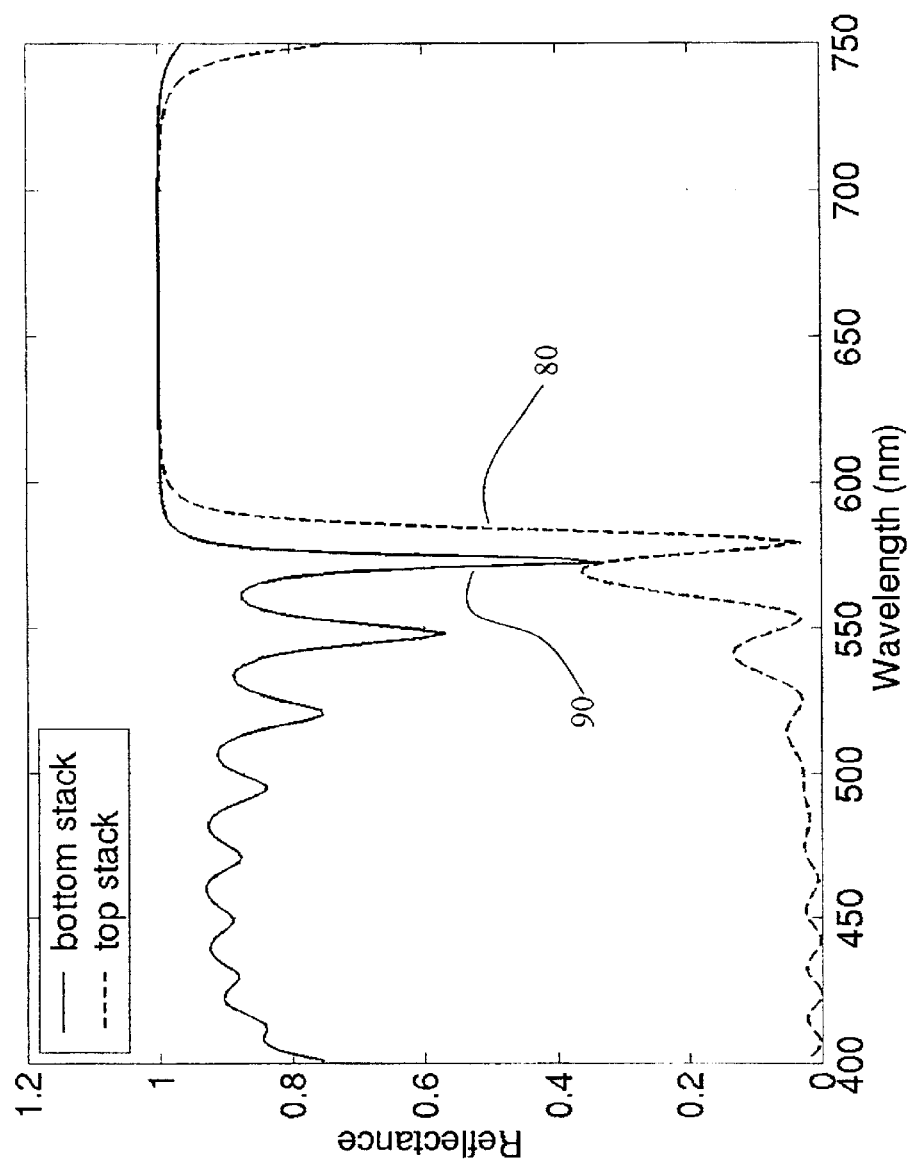
FIG. 2 shows a graph of calculated top and bottom dielectric stack reflectances.

The bottom and top dielectric stacks 30 and 50 are preferably deposited by conventional electron-beam deposition and are composed of alternating high index and low index dielectric materials, such as, $TiO_2$ and $SiO_2$, respectively. Other materials, such as $Ta_2O_5$ for the high index layers, could be used. The bottom dielectric stack 30 is deposited at a temperature of approximately 240° C. During the top dielectric stack 50 deposition process, the temperature is maintained at around 70° C. to avoid melting the organic active materials. In an alternative embodiment of the present invention, the top dielectric stack is replaced by the deposition of a reflective metal mirror layer. Typical metals are silver or aluminum, which have reflectivities in excess of 90%. In this alternative embodiment, both the pump-beam 60 and the laser emission 70 would proceed through the substrate 20. Both the bottom dielectric stack 30 and the top dielectric stack 50 are reflective to laser light over a predetermined range of wavelengths. It has been found by experimentation that in order to obtain lasing peaks with full widths at half-maximum (FWHM) less than 1 nm, it is necessary to have the reflectances of both the top and bottom dielectric stacks be greater than 99% at the laser emission wavelength. FIG. 2 shows, as a function of wavelength, the calculated top dielectric stack reflectance 80 and the bottom dielectric stack reflectance 90 for a laser cavity designed for 660 nm laser emission. For the calculation it was assumed that the pump-beam 60 and the laser emission 70 passed through the top dielectric stack 50. Extra layers were added to the dielectric stack designs so that the bottom dielectric stack 30 was very reflective to the pump-beam (at 404 nm), while the top dielectric stack 50 was very transmissive to the pump-beam 60. As a result, the top and bottom dielectric stacks contained 25 and 29 layers, respectively, of $SiO_2$ and $TiO_2$.

Figure 3:
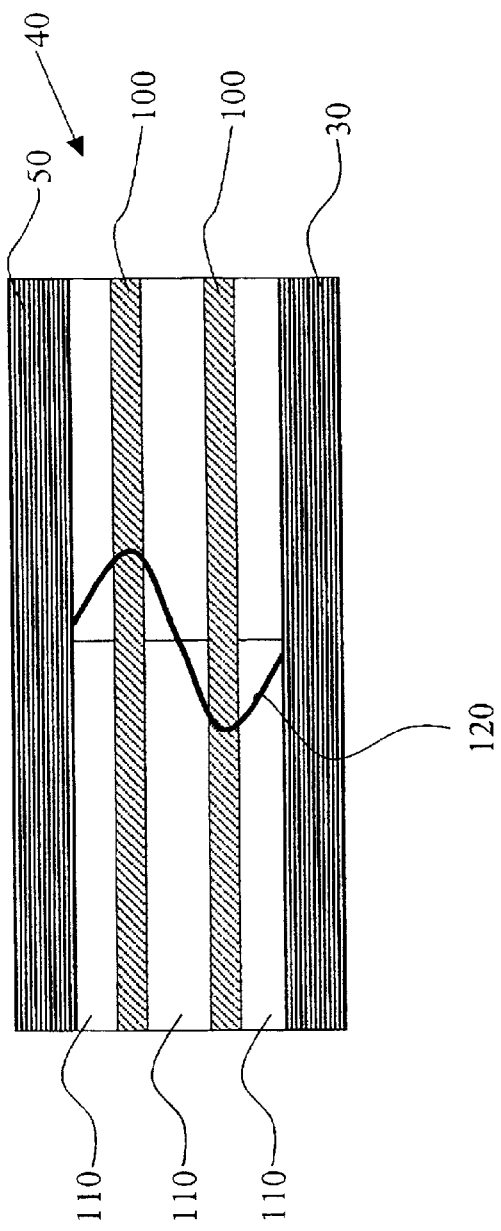
FIG. 3 is a side view schematic of an optically pumped organic-based vertical cavity laser showing gain region placement within the active region according to the present invention.

FIG. 3 is a side view schematic of the vertical cavity organic laser structure 10 with a more detailed view of the organic active region 40. The organic active region 40 includes one or more periodic gain regions 100 and organic spacer layers 110 disposed on either side of the periodic gain regions and arranged so that the periodic gain regions are aligned with the antinodes of the device's standing wave electromagnetic field. This is illustrated in FIG. 3 where the laser's standing electromagnetic field pattern 120 in the active region 40 is schematically drawn. Since stimulated emission is highest at the antinodes and negligible at the nodes of the electromagnetic field, it is inherently advantageous to form the active region 40 as shown in FIG. 3. The spacer layers 110 do not undergo stimulated or spontaneous emission and largely do not absorb either the laser emission 70 or the pump-beam 60 wavelengths. An example of a spacer layer 110 is the organic material 1,1-Bis-(4-bis(4-methyl-phenyl)-amino-phenyl)-cyclohexane (TAPC). TAPC works well as the spacer material since it largely does not absorb either the laser output or the pump-beam and, in addition, its refractive index is slightly lower than that of most organic host materials. This refractive index difference is useful since it helps in maximizing the overlap between the electromagnetic field antinodes and the periodic gain region(s) 100. As will be discussed below with reference to the present invention, employing periodic gain region(s) instead of a bulk gain region results in higher power conversion efficiencies and a significant reduction of the unwanted spontaneous emission.

The preferred material for the periodic gain region(s) 100 is a small-molecular weight organic host-dopant combination typically deposited by high-vacuum thermal evaporation. These host-dopant combinations are advantageous since they result in very small unpumped scattering/absorption losses for the gain media. It is preferred that the organic molecules be of small-molecular weight since the layers can be deposited more uniformly. The host materials used in the present invention are selected from any materials that have sufficient absorption at the pump-beam 60 wavelength and are able to transfer a large percentage of their excitation energy to the dopant material via Forster energy transfer. Those skilled in the art are familiar with the concept of Forster energy transfer, which involves a radiationless transfer of energy between the host and dopant molecules. An example of a useful host-dopant combination for red emitting layers is Alq [aluminum tris(8-hydroxyquinoline)] as the host material and 1% DCJTB [4-(dicyanomethylene)-2-t-butyl-6-(1,1,7,7-tetramethyljulolidyl-9-enyl)-4H-pyran] as the dopant. Other host-dopant combinations can be used for other wavelength emissions, such as, in the green and blue parts of the visible spectrum. Other organic gain region materials can be polymeric substances, e.g., polyphenylenevinylene derivatives, dialkoxy-polyphenylenevinylenes, poly-paraphenylene derivatives, and polyfluorene derivatives, as taught by Wolk et al. in commonly assigned U.S. Pat. No. 6,194,119 B1 and references therein.

Figure 4:
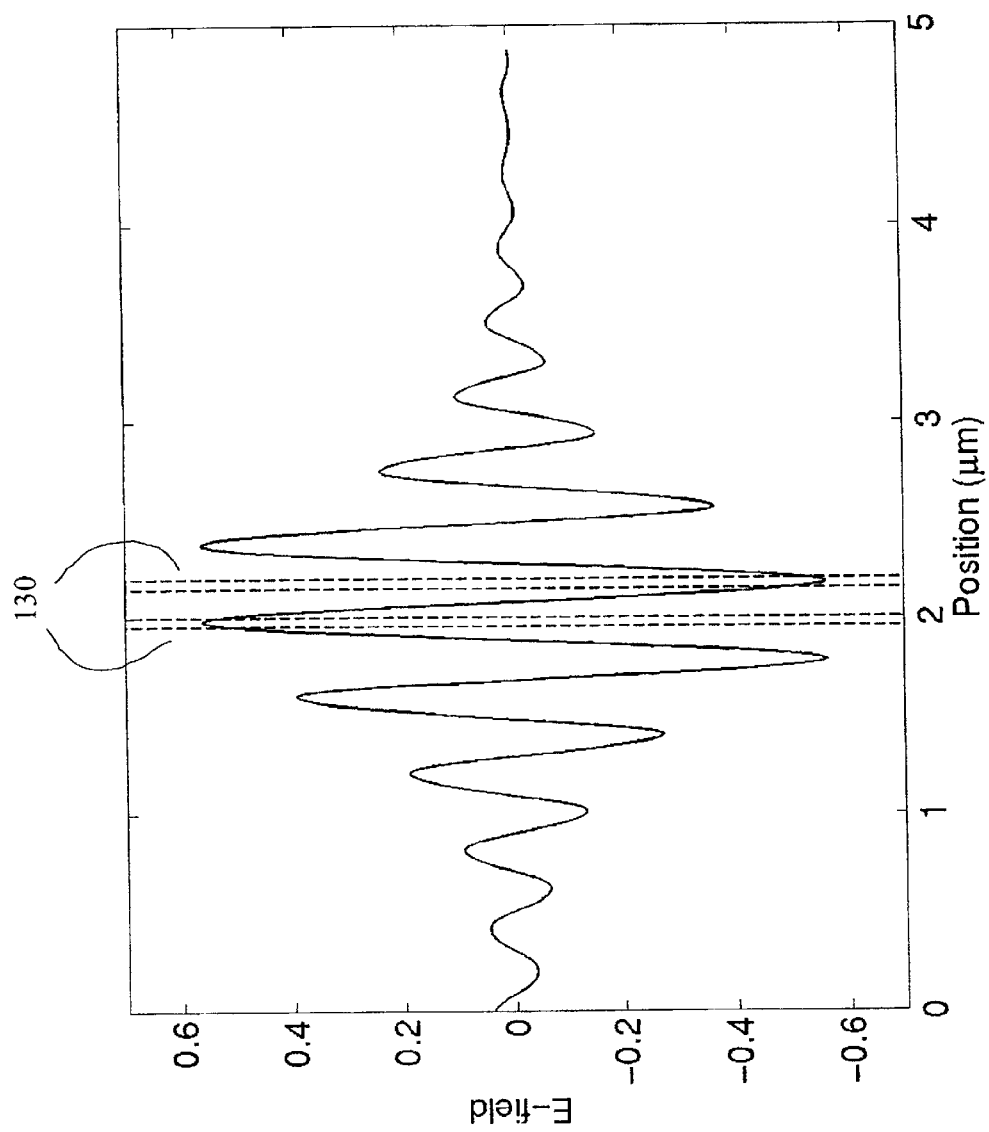
FIG. 4 shows a graph of a calculated standing wave electric field pattern in the laser cavity.

The placement of the gain region(s) is determined by using the standard matrix method of optics (Corzine et al. IEEE J. Quant. Electr. 25, 1513 [1989]). A sample of a typical calculation is illustrated in FIG. 4 for a vertical cavity organic laser device 10. In the calculation it was assumed that the periodic gain region 100 contained two 50 nm thick layers (composed of Alq with 1% DCJTB), with spacer layers 110 composed of TAPC. To get good results, the thicknesses of the periodic gain region layers need to be at or below 50 nm. The peak reflectance of the bottom dielectric stack was about 99.98% at 660 nm, while that of the top stack was ~99.9% at 660 nm, where the laser cavity was designed for laser emission through the top dielectric stack. In the figure, the double pair of vertical dashed lines 130 demarcate the position of the periodic gain regions 100. The surrounding optimized TAPC spacer layer 110 thicknesses were (starting from the bottom dielectric stack side) 167, 146, and 172 nm, respectively, for an emission wavelength of 660 nm. As can be seen from the figure, the two periodic gain regions line up exactly with the central antinodes. In addition, note that the electromagnetic field decays into both dielectric stacks, more so in the higher reflectance bottom dielectric stack located on the right side of FIG. 4. As a result, a negligible amount of laser light leaks into the substrate, while some laser light is emitted through the top dielectric stack of the device.

The following example is presented for further understanding of the present invention and is not to be construed as limitations thereon.

EXAMPLE

To test the devices for both their spectral and power characteristics, an organic vertical cavity laser structure 10 was deposited on a 4-inch silicon substrate. Over the substrate was deposited, by conventional electron beam deposition, the bottom dielectric stack 30, which was composed of alternating low and high refractive index layers of $SiO_2$ and $TiO_2$, respectively. The bottom dielectric stack had a peak reflectance of ~99.95% at 660 nm. On top of the bottom dielectric stack was deposited, by high-vacuum thermal evaporation, the active region 40. Two cases are compared: (1) The active region consists of a single 150 nm thick gain region (of Alq and 1% DCJTB); and (2) the active region consists of two 20 nm thick periodic gain regions (Alq and 1% DCJTB) with TAPC spacer layers disposed on each side of them. The thicknesses of the TAPC spacer layers, starting from the bottom dielectric stack side, were 188, 166, and 192 nm, respectively. Following the active region was deposited the top dielectric stack composed of alternating layers of $SiO_2$ and $TiO_2$, such that its resulting measured peak reflectance was 99.85% at 660 nm. The top dielectric stack was deposited by electron-beam deposition at an average substrate temperature of 72° C. The pump-beam 60 was the 404 nm output from a 5 mW Nichia laser diode and was directed onto the top dielectric stack at approximately 30° from the normal. The pump laser produced 50 nsec laser pulses at a repetition rate of 5 KHz. The pump-beam intensity was adjusted by the combination of two neutral density wheels, and it was focused on the laser cavity surface using a 50x-microscope objective lens. Through the use of a near-field camera system focused on the top surface of the device, a spot size of ~2×3 $\mu$m was measured. The laser emission 70 from the cavity was focused on the entrance slit of a Spex double monochrometer (0.22 m) by the combination of a 50 mm f2 lens and a 100 mm f4 lens nearest the slit (resulting in a 2×magnification of the laser's near-field image). The resolution of the monochrometer is approximately 0.45 nm; its output was detected by a cooled Hamamatsu photomultiplier tube.

Figure 5:
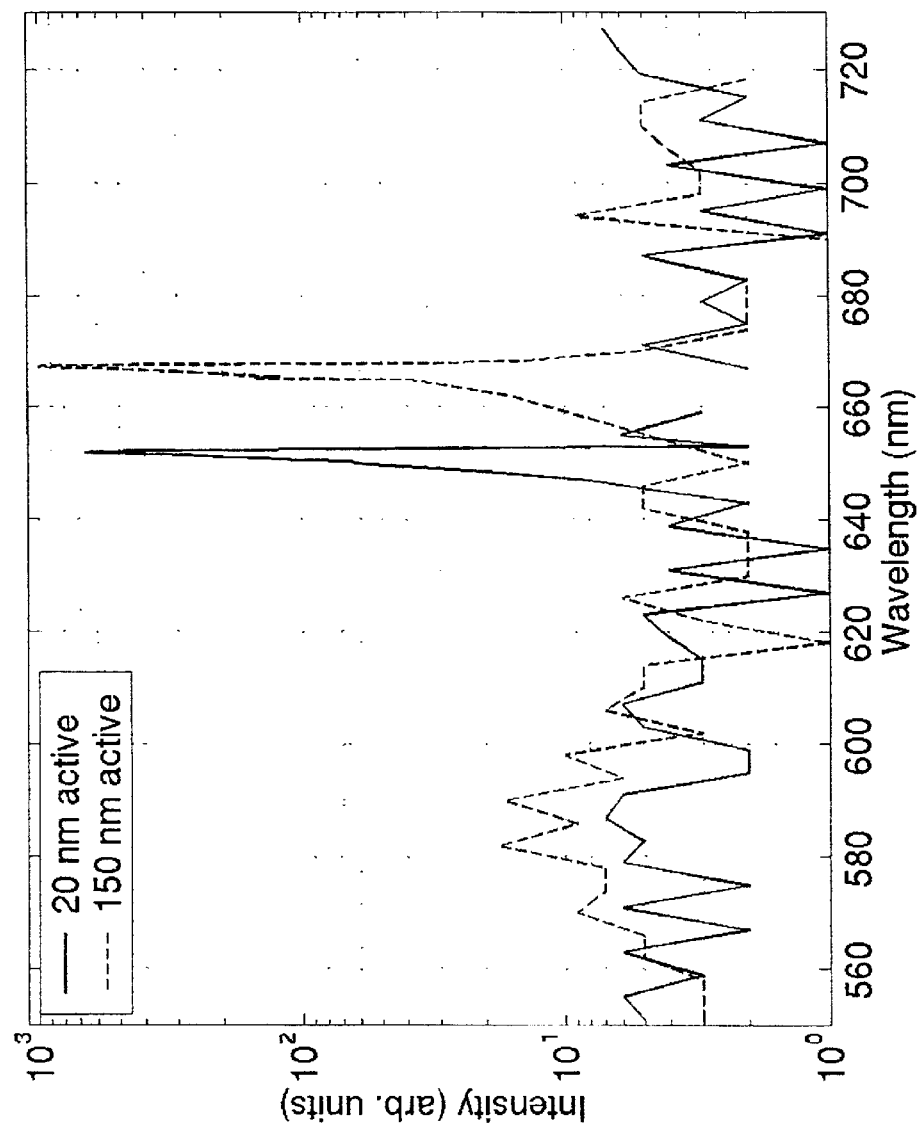
FIG. 5 shows a graph of the measured optical power spectrum comparing vertical cavity lasers with a bulk gain region versus a periodic gain region.

FIG. 5 gives the emission spectra for the two different laser cavities excited by the same pump-beam intensity. Using a 0.25 NA (numerical aperture) collection lens, the lasing peaks for the two samples (150 nm thick gain region and two 20 nm thick gain regions) had FWHM of 0.68 and 0.66 nm, respectively. It is very interesting to note that in spite of absorbing over a factor of 2.5 more pump-beam intensity, the bulk active region's (150 nm thick) laser emission peak is only a factor of 1.4 times larger. In addition, for the device containing two 20 nm thick gain regions, its spontaneous emission signal was within the noise background of the spectrometer, while the bulk active region case resulted in a noticeable signal around 585 nm. This later result can be justified by referring back to FIG. 2, where at 585 nm the top dielectric stack reflectance begins to drop off significantly, letting through any available spontaneous emission. Thus, the usage of periodic gain region(s) both enhances the power conversion efficiency, while greatly lowering the emitted spontaneous emission signal. The main reason for the lack of a detectable spontaneous emission signal (when using periodic gain regions) is that the stimulated emission is at its peak efficiency at the antinodes, and with the stimulated emission rate being approximately three orders of magnitude faster than that for spontaneous emission, all of the available energy in the periodic gain regions is converted into stimulated emission. The spontaneous emission signal resulting from a 370 nm thick bulk gain region was also measured. For that case, over a factor of three more signal strength was obtained than that for the 150 nm thick bulk gain region case. Again, the spontaneous emission signal peaked around 585 nm.

Figure 6:
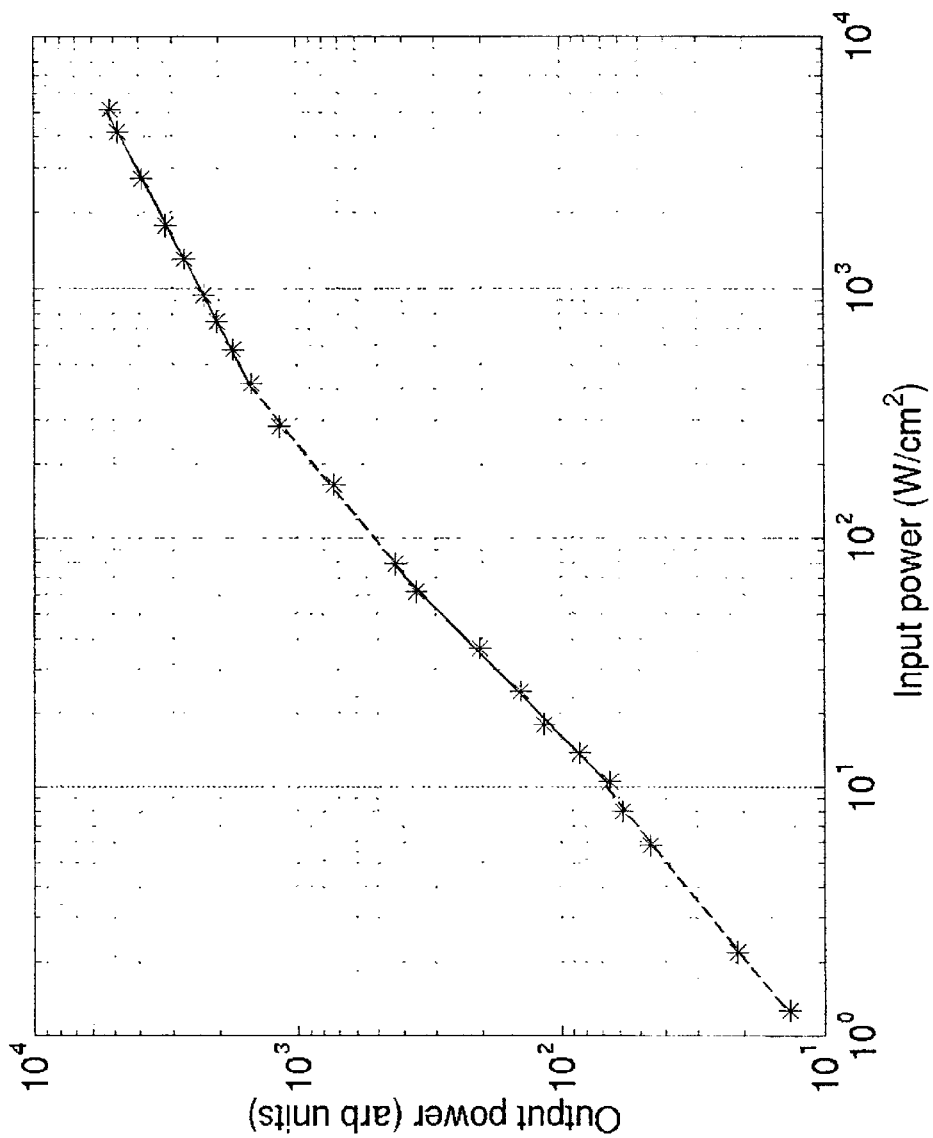
FIG. 6 is a graph depicting optical output power versus input power of a vertical cavity organic laser containing a periodic gain region.

A plot of the pump-beam power in versus laser emission power output is given in FIG. 6. As is well known to those practiced in the art, the lasing transition shows a kink in the power plot. As can be seen from the figure, the vertical cavity laser has a power density threshold of ~10 $W/cm^2$. This result is an order of magnitude lower than the previous best reported in the organic laser literature (M. Berggren et al., Nature 389, 466 [1997]). The large drop in threshold is due to the usage of a microcavity design employing double dielectric stacks whose active region uses periodic gain region(s) composed of an organic host-dopant combination. The figure shows that following the sharp rise in slope after the lasing threshold, the slope once more begins to fall off for input power densities an order of magnitude above lasing. The majority of this fall off can be attributed to non-lasing phenomena since an analogous fall off also occurs for samples containing no dielectric stacks (and thus only emit spontaneous emission) at comparable power density levels. It should be noted that in inorganic VCSELs these power saturation effects are due to local heating phenomena (S. W. Corzine et al., IEEE J. Quant. Electr. 25, 1513 [1989]).

The invention has been described in detail with particular reference to certain preferred embodiments thereof, but it will be understood that variations and modifications can be effected within the spirit and scope of the invention.

Parts List 10 vertical cavity organic laser device
20 substrate
30 bottom dielectric stack
40 organic active region
50 top dielectric stack
60 pump-beam
70 laser emission
80 top dielectric stack reflectance
90 bottom dielectric stack reflectance
100 periodic gain regions
110 spacer layers
120 standing electromagnetic field pattern
130 vertical lines depicting periodic gain region placement

What is claimed is:

1. An organic vertical cavity laser light producing device, comprising:

a) a bottom dielectric stack reflective to light over a predetermined range of wavelengths;

b) an organic active region for producing laser light;

c) a top dielectric stack spaced from the bottom dielectric stack and reflective to light over a predetermined range of wavelengths;

d) the organic active region includes one or more periodic gain region(s) and organic spacer layers disposed on either side of the periodic gain region(s) and arranged so that the periodic gain region(s) is aligned with the antinodes of the device's standing wave electromagnetic field.

2. The organic vertical cavity laser light producing device of claim 1 wherein pump-beam light is transmitted and introduced into the organic active region through at least one of the dielectric stacks.

3. The organic vertical cavity laser light producing device of claim 1 wherein the organic active region is a combination of a host material and a dopant and the spacer layer is substantially transparent to the pump-beam and laser light.

4. The organic vertical cavity laser light producing device of claim 3 wherein the host material is aluminum tris(8-hydroxyquinoline), the dopant is [4-(dicyanomethylene)-2-t-butyl-6-(1,1,7,7-tetramethyljulolidyl-9-enyl)-4H-pyran], and the organic spacer layers are 1,1-Bis-(4-bis(4-methylphenyl)-amino-phenyl)-cyclohexane.

5. The organic vertical cavity laser light producing device of claim 1 wherein the organic active region includes polymeric materials.

6. An organic vertical cavity laser light producing device, comprising:

a) a first dielectric stack reflective to light over a predetermined range of wavelengths;

b) an organic active region for producing laser light;

c) a second metallic layer spaced from the first dielectric stack and reflective to light;

d) the active region includes one or more periodic gain region(s) and organic spacer layers disposed on either side of the periodic gain region(s) and arranged so that the periodic gain region(s) is aligned with the antinodes of the device's standing wave electromagnetic field.

* * * * *